United States Patent [19]

Suzuki et al.

[11] Patent Number: 5,354,412
[45] Date of Patent: Oct. 11, 1994

[54] METHOD OF MAKING A COMPOUND SEMICONDUCTOR DEVICE

[75] Inventors: Yasutoshi Suzuki, Okazaki; Koki Mizuno, Kasugai, both of Japan

[73] Assignee: Nippondenso Co., Ltd., Kariya, Japan

[21] Appl. No.: 943,416

[22] Filed: Sep. 11, 1992

[30] Foreign Application Priority Data

Sep. 13, 1991 [JP] Japan .................. 3-235191

[51] Int. Cl.$^5$ .............................. C30B 23/02
[52] U.S. Cl. ........................ 117/99; 118/725; 117/954
[58] Field of Search ............. 156/606, 610, 611, 612, 156/613, 614; 118/715, 725, 728; 437/107, 108, 234; 427/110

[56] References Cited

U.S. PATENT DOCUMENTS

| | | | |
|---|---|---|---|
| 4,368,098 | 1/1983 | Manasevit | 156/612 |
| 4,636,268 | 1/1987 | Tsang | 156/611 |
| 4,639,377 | 1/1987 | Yamamoto | 156/611 |
| 4,838,201 | 6/1989 | Fraas et al. | 118/719 |
| 4,900,518 | 2/1990 | Mcleod et al. | 422/199 |
| 4,951,603 | 8/1990 | Yoshino et al. | 118/719 |
| 4,979,465 | 12/1990 | Yoshino et al. | 118/717 |
| 5,166,092 | 11/1992 | Mochizuki et al. | 437/107 |
| 5,173,445 | 12/1992 | Ando et al. | 437/107 |

FOREIGN PATENT DOCUMENTS 236059 8/1990 Japan .
236060 8/1990 Japan .

OTHER PUBLICATIONS

"Growth and characterization of GaAs on Si by vacuum chemical epitaxy" J. Appln. Phys 69 (2), Jan. 15, 1991.
"Metalorganic ~ Si substrate" Appl. Phys. Lett. 57 (25), Dec. 17, 1990.
English Abstract of JP 2-36059 Aug. 1980.
English Abstract of JP 2-36060 Aug. 1980.

*Primary Examiner*—R. Bruce Breneman
*Assistant Examiner*—Felisa Garrett
*Attorney, Agent, or Firm*—Cushman, Darby & Cushman

[57] ABSTRACT

A process for epitaxially growing a compound semiconductor layer containing at least arsenic on a single crystal silicon substrate, which prevents the silicon impurity from intruding said compound semiconductor layer. The process comprises supplying one of the starting material gas, $ASH_3$, into the reaction furnace to effect growth, but in such a manner that the $AsH_3$ gas is pyrolyzed in advance to thereby supply arsenic alone either in an atomic or a molecular state. The GaAs layer is thus epitaxially grown on a single crystal silicon substrate in the crystal growing chamber, i.e., the reaction furnace in the apparatus, under an atmosphere comprising atomic or molecular arsenic at a temperature in the range of from 400° to 650° C. and at a vacuum degree of about 0.1 Pa. By thus epitaxially growing GaAs layer under an atmosphere comprising atomic or molecular arsenic, the intrusion of silicon impurity into the GaAs layer during its growth can be effectively prevented. Furthermore, an undoped GaAs layer, a p-GaAs layer, and an n-GaAs layer in this order can be deposited on the silicon substrate consecutively by using carbon (C) as a p-type dopant which can be supplied from trimethylgallium, thereby realizing a steep step-like junction at the n-GaAs/p-GaAs interface.

14 Claims, 13 Drawing Sheets

METHOD OF MAKING A COMPOUND SEMICONDUCTOR DEVICE

BACKGROUND OF THE INVENTION

1. Field of the Invention

The present invention relates to a process for fabricating a compound semiconductor device, and more particularly, to a process which comprises epitaxially growing a compound semiconductor layer containing at least arsenic on the surface of a single crystal silicon substrate.

2. Description of the Related Arts

It has been believed difficult to grow a high-quality single GaAs crystal on the surface of a silicon substrate due to the differences between those two substances in lattice constants and in thermal expansion coefficients. However, a high-quality single GaAs crystals can be grown directly on a silicon substrate by employing MOCVD (metallorganic chemical vapor deposition) techniques, provided that specified conditions are selected, as disclosed in JP-A-Sho-63-133616 (the term "JP-A-" referred herein signifies "an unexamined published Japanese patent application"), JP-B-Hei-2-36059 (the term "JP-B-" as referred herein signifies "an examined published Japanese patent application"), JP-B-Hei-2-36060, etc.

Figure 13:
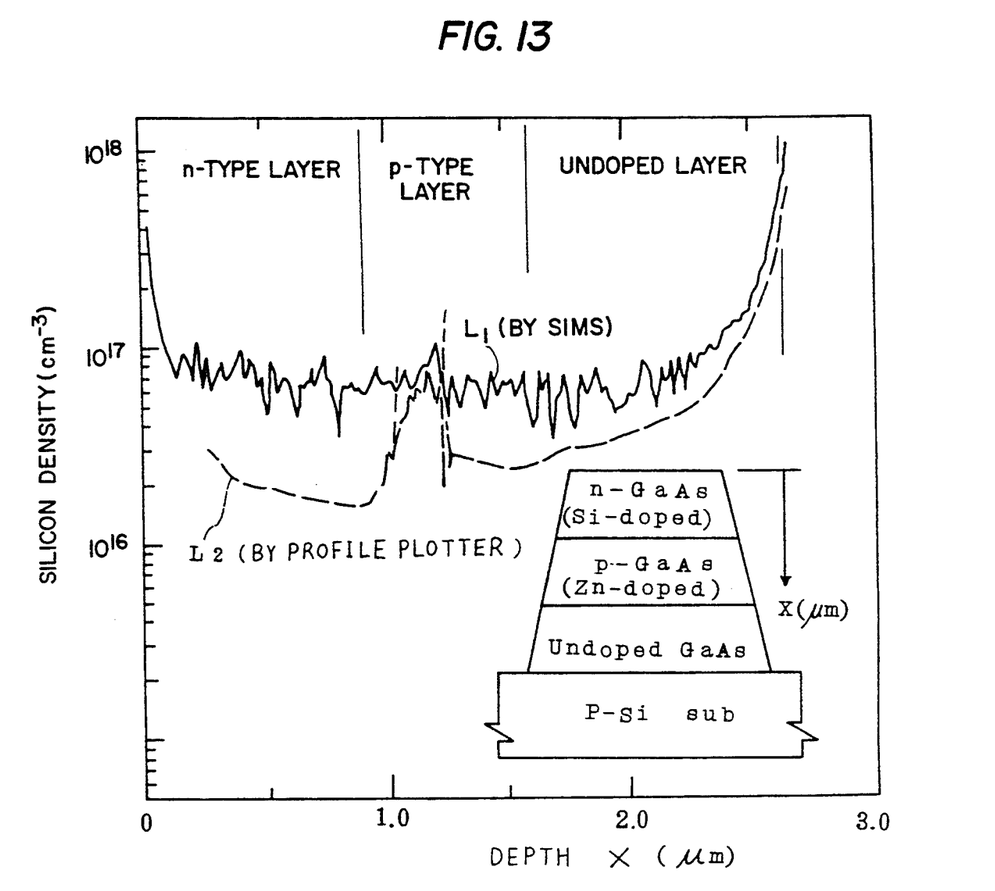
FIG. 13 is a graph showing the silicon distribution found along the depth direction of a layer.

It has been revealed, however, that the GaAs layer obtained by the aforementioned process contains, as shown in FIG. 13, the carrier distribution profile along the depth direction of a GaAs layer on a silicon substrate, silicon as an impurity at a density as high as to amount to about $10^{17}$ cm$^{-3}$. Accordingly, an n-GaAs/p-GaAs/undoped GaAs structure fabricated by this process fails to have its carrier density controlled due to the presence of silicon impurities. In FIG. 13, the characteristic curve indicated by L1 is for the density of the silicon impurity measured with a secondary ion mass spectrometer (SIMS), and the characteristic curve L2 represents the density of active silicon (carrier density) as obtained by a C-V method using a Profile Plotter (a product of Polaron Corp.).

This phenomena of introducing silicon impurities into a MOCVD-deposited GaAs layer on a silicon substrate has been pointed out also by S. Nozaki et al., in Appl. Phys. Lett., 57(25), p. 2669 (Dec. 17, 1990), but the mechanism of taking up silicon impurities is still unclarified.

SUMMARY OF THE INVENTION

An object of the present invention is to provide a process for fabricating a semiconductor device which comprises epitaxially growing a compound semiconductor layer containing at least arsenic on the surface of a single crystal silicon substrate, which prevents silicon impurities from intruding into the compound semiconductor layer containing at least arsenic.

Figure 2:
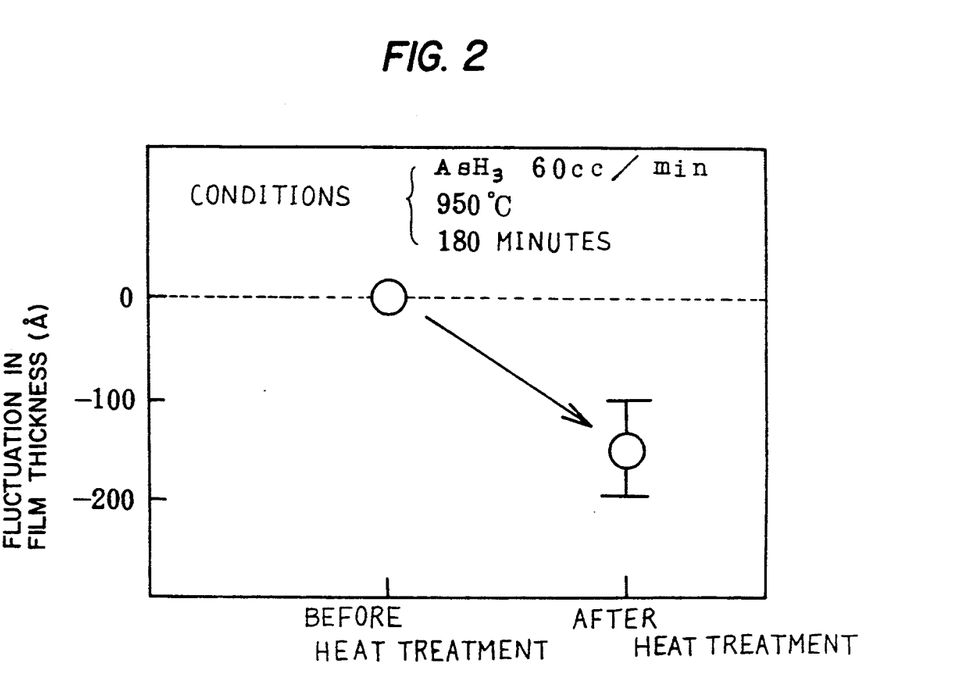
FIG. 2 is a graph showing fluctuation in film thickness before and after heat treatment.

With a view to clarify the problem above, an experiment schematically shown in FIG. 2 was conducted. A silicon substrate was heated at 950° C. for 180 minutes while exposing it to an AsH$_3$ atmosphere, and the change in thickness thereof was measured. It was found that the silicon substrate was etched to a depth of about 200Å during this heat treatment. Accordingly, it was concluded that silicon suffers etching when treated under a high temperature in AsH$_3$ atmosphere. Considering that a large amount of AsH$_3$ is used as the material gas in the MOCVD process and that the surface of a silicon substrate is very reactive, being furnished with a large number of dangling bonds, it seems quite natural that the Si is etched by AsH$_3$ and is incorporated into GaAs as impurities.

Accordingly, the fabrication process according to the present invention is characterized by the fact that a compound semiconductor layer containing at least arsenic is epitaxially grown on a single crystal silicon substrate without using a hydride of arsenic, ASH$_3$, but instead, is grown in an atmosphere in which arsenic is brought into separate atoms or molecules; in short, the growth of GaAs is carried out under such an arsenic atmosphere free of AsH$_3$.

In the process according to the present invention, a compound semiconductor layer containing at least arsenic is grown epitaxially on a single crystal silicon substrate under an arsenic atmosphere comprising arsenic in separated atoms or molecules. Thus, the silicon in the silicon substrate is not etched during the process, and thereby no silicon is taken up by the compound semiconductor layer containing at least arsenic.

In an atmosphere comprising hydrogen such as AsH$_3$, etching of silicon occurs, and, during the growth of an arsenic compound semiconductor layer, the compound semiconductor layer containing at least arsenic takes up silicon to be rendered n+-conductive. However, by epitaxially growing the compound semiconductor layer containing at least arsenic on a single crystal silicon substrate under an atmosphere consisting of arsenic in an atomic state or a molecular state, a compound semiconductor layer containing at least arsenic can be obtained without taking up any silicon.

DETAILED DESCRIPTION OF THE EMBODIMENTS

Referring to the drawings, an embodiment according to the present invention is described hereinafter.

Figure 1:
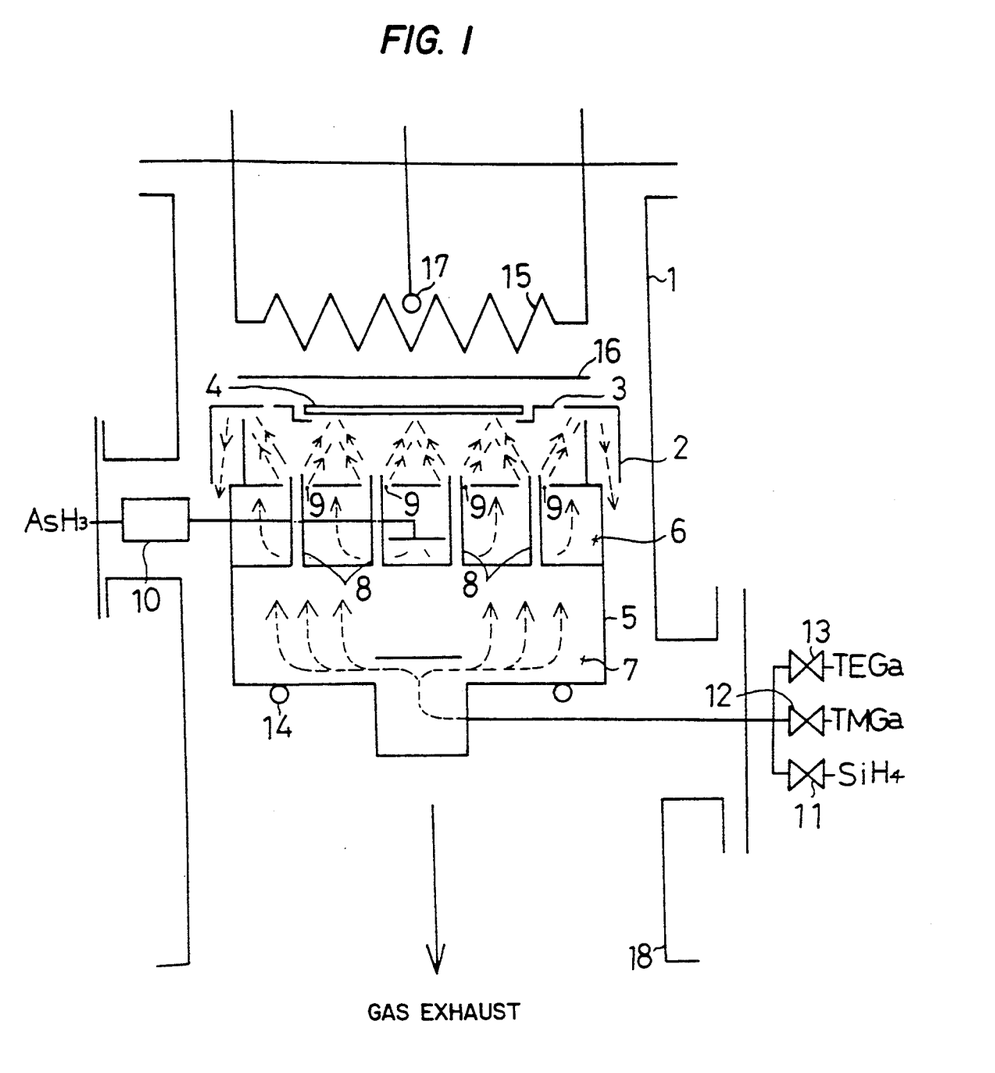
FIG. 1 shows schematically the crystal growth chamber of an epitaxial crystal growing apparatus.
Figure 3:
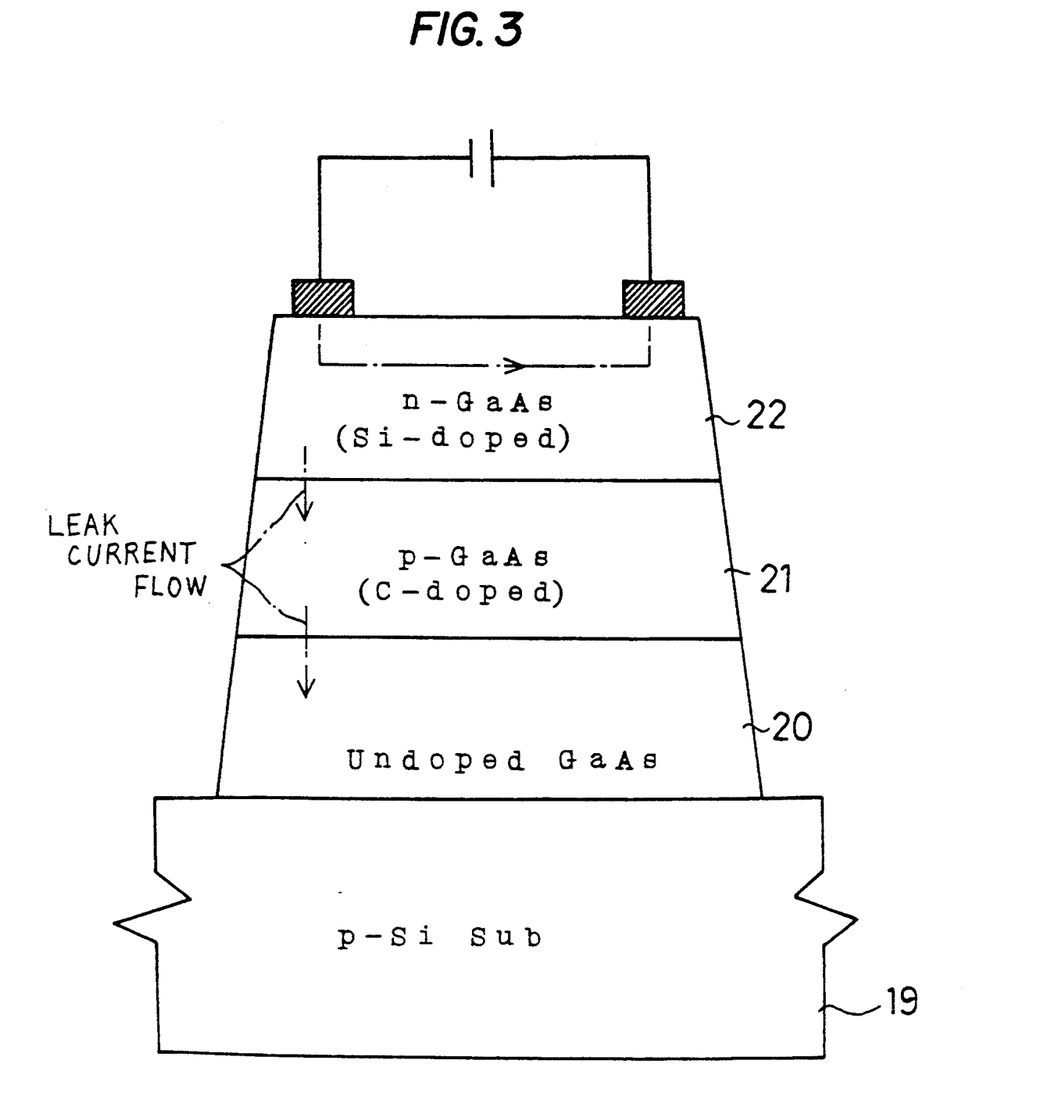
FIG. 3 illustrates a structure of a semiconductor device assembled with a Hall effect sensor.

FIG. 1 shows schematically a crystal growth chamber provided in an epitaxial crystal growing apparatus. FIG. 3 shows a structure of a semiconductor device assembled with a Hall effect sensor according to the present invention. The semiconductor device comprises a p-type single crystal silicon substrate 19 having established thereon an n-GaAs layer 22 as the active layer for the Hall generator, and an undoped GaAs layer 20 and a p-GaAs layer 21 as the barrier layer are incorporated between substrate 19 and the n-GaAs layer 22. The GaAs layers 20, 21, and 22 are deposited on the single crystal silicon substrate 19 under programmed temperature control as shown in the diagram in FIG. 4.

Referring to FIG. 1, the structure of the crystal growth chamber of the epitaxial crystal growing apparatus is explained hereinafter. The stainless-steel chamber 1 comprises in the central portion thereof a graphite reactor 2. A wafer tray 3 is provided on the upper portion of the central reactor 2, so that a wafer 4 may be mounted thereon. A manifold block 5 is also provided at the lower portion of the reactor 2. The manifold block 5 is separated into an upper chamber 6, which corresponds to a first diffusion chamber, and a lower chamber 7 corresponding to a second diffusion chamber. The lower chamber 7 is further connected with the inside of the reactor 2 via a plurality of communicating pipes 8 which penetrate the upper chamber 6. To the outer periphery of the communicating pipes 8 in the upper chamber 6 is provided a gas supply inlet 9, and the upper chamber 6 is communicated to the inside of the reactor 2 by this gas supply inlet 9.

The upper chamber 6 is connected to an $AsH_3$ supply source via a heating furnace 10. The $AsH_3$ is heated in the heating furnace 10 to 800° C. so that it will decompose into atomic or molecular arsenic (As), and the arsenic thus produced is supplied in the upper chamber 6 downward and then diffused along the horizontal direction so that it may be blown out through the gas supply inlet 9 toward the wafer 4. The lower chamber 7 is connected to an $SiH_4$ supply source via a valve 11, a trimethylgallium (TMGa) supply source via a valve 12, and a triethylgallium (TEGa) supply source via a valve 13. Thus, $SiH_4$, TMGa, and TEGa are supplied to the lower chamber 7 by opening the valves 11, 12, and 13, and are then diffused horizontally in the chamber so that they may be blown out toward the wafer 4 through the communicating pipes 8. In the meantime, the manifold block 5 is cooled by cooling water supplied to a cooler pipe 14.

Inside the chamber 1 is also provided a resistance heater 15 at the upper side of the reactor 2, incorporating a soaking plate 16 between the heater 15 and the wafer 4. Thus, upon supplying an electric current to the resistance heater 15, the heater 15 emits heat so that the wafer 4 being set on the wafer tray 3 may be uniformly heated via the soaking plate 16. The resistance heater 15 is further furnished with a thermocouple 17 being placed at the vicinity of the heater, so that the temperature change with the emitted heat may be detected and thereby controlled suitably for the wafer. Furthermore, the gas inside the chamber 1 is discharged through an exhaust gas outlet 18 provided on the lower face of the chamber 1.

Then, referring to FIG. 3, a process using the epitaxial crystal growing apparatus above for fabricating a semiconductor device comprising a Hall generator assembled therein is described.

First, a single crystal silicon substrate 19 is prepared by a process comprising: chemically cleaning a p-type single crystal silicon substrate 19; removing the naturally oxidized surface oxide layer using a dilute hydrofluoric acid; and then cleaning with pure water. In this manner a single crystal silicon substrate 19 can be obtained.

The single crystal silicon substrate 19 thus obtained is set on a substrate carrier inside a cassette chamber, followed immediately thereafter by evacuating the whole chamber to thereby prevent the substrate surface from being oxidized by the atmosphere. The single crystal silicon substrate 19 is then mounted on the wafer tray 3 as shown in FIG. 1 by means of a transportation robot, so that the substrate may be conveyed to a predetermined position.

Figure 4:
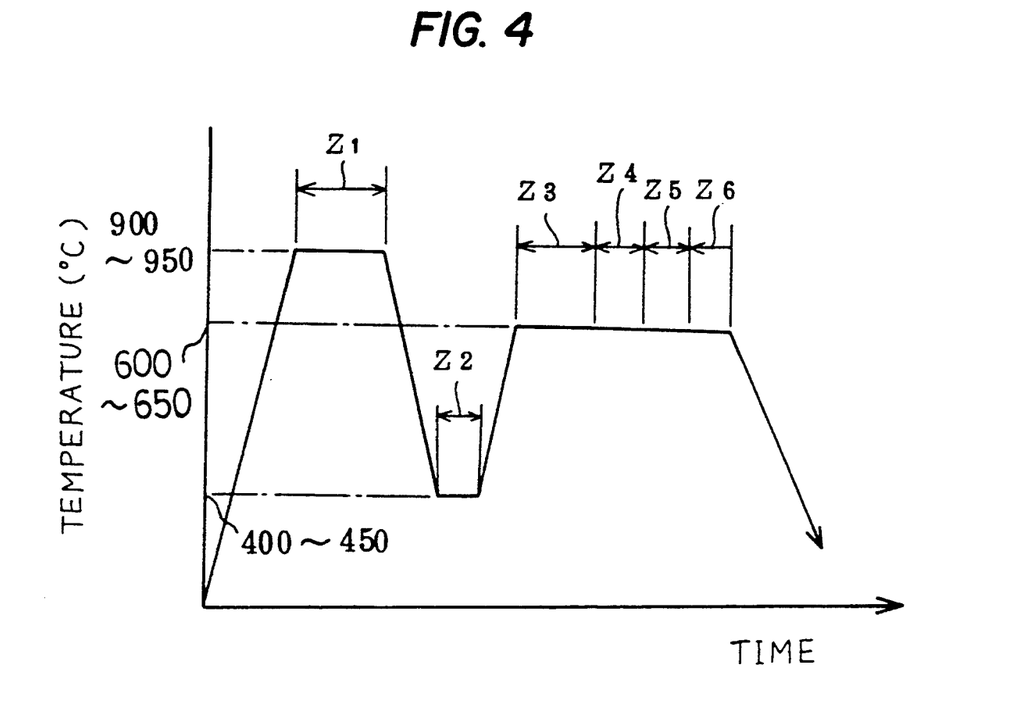
FIG. 4 shows a diagram for temperature-programmed control during the growth of GaAs on a single crystal silicon substrate.

Subsequently thereafter, electric power is supplied to the resistance heater 15 (shown in FIG. 1) in such a manner that the temperature inside the apparatus may be controlled in accordance with the temperature program as shown in the diagram of FIG. 4. At this point, the temperature of the heating furnace 10 for the $AsH_3$ gas is already elevated to 800° C. so that atomic or molecular arsenic (As) is supplied to the single crystal silicon substrate 19 from the gas supply inlet 9 through the upper chamber 6. In the initial stage of heating, the single crystal silicon substrate 19 is cleaned on the surface by elevating the atmospheric temperature to a range of from 900° to 950° C. and maintaining the temperature for a duration of from 5 to 20 minutes while supplying the atomic or molecular arsenic. The surface of the substrate is cleaned by such a heat treatment as indicated by Z1 in the diagram of FIG. 4.

Then, the temperature of the resistance heater is lowered so that the temperature of the atmosphere surrounding the substrate may fall in the range of from 400° to 450° C.. The temperature is maintained in this range to allow GaAs layer to grow in a low temperature. In the meantime with the temperature being maintained in this range, TEGa is supplied through the valve 13 to the heating furnace together with the atomic or molecular arsenic, to thereby deposit a single crystal GaAs film, inclusive of twin crystals, to a thickness of 200Å or less on the single crystal silicon substrate 19. This step is illustrated in the diagram of FIG. 4 by Z2. In this step, $AsH_3$ and TEGa are supplied at such a rate so that the As/Ga mole-to-mole ratio is 20.

Furthermore, the vacuum degree during the GaAs growth must be controlled in such a manner that the longer of the mean free path for the atomic or molecular arsenic and that for the Ga molecule be still longer than the distance between the gas supply inlet 9 and the single crystal silicon substrate 19. A specific example of the degree of vacuum is about 0.1 Pa.

Then, while still continuing the supply of the atomic or molecular arsenic, the supply of TEGa is stopped, and the temperature of the resistance heater 15 is elevated to control the atmospheric temperature around the single crystal silicon substrate to a range of from 600° to 650° C. The temperature is equal to or higher than the temperature at which the main GaAs crystal growth process is effected. The heat treatment in this temperature range is carried out for a duration of from 10 to 20 minutes, as shown at Z3 in the temperature program diagram of FIG. 4. As a result of the heat treatment, the GaAs layer having grown in the low temperature process indicated by Z2 in FIG. 4 undergoes a morphological transformation to give islands of single crystal GaAs free from twins. The temperature of the atmosphere surrounding the single crystal silicon substrate 19 is controlled to be that at which the main GaAs crystal growth is effected, and under such a condition, the atomic or molecular arsenic having been prepared in the heating furnace 10 is supplied together with TEGa through valve 13. In this manner, GaAs single crystals are grown using the GaAs islands above as the growth nuclei. This step is indicated by Z4 in the diagram of FIG. 4. Thus, an undoped GaAs layer 20 can be obtained on a single crystal silicon substrate 19 as a result.

Then, a p-GaAs layer 21 is deposited to a thickness as desired on the undoped GaAs layer 20 using a starting material gas into which a trace amount of TMGa is added. This step is illustrated in the diagram of FIG. 4 by Z5. In this step, carbon (C) in TMGa is used as the dopant. Upon completion of TMGa gas supply, a trace amount of $SiH_4$ gas is added to the material gas to deposit an n-GaAs layer 22 to a desired thickness on the p-GaAs layer 21. This step is indicated by Z6 in the diagram of FIG. 4. In this step, the dopant is silicon (Si) which is supplied from $SiH_4$.

In this manner, GaAs layers 20, 21, and 22 are deposited each at a desired thickness. Then, the supply of $SiH_4$ and TEGa gases is stopped, and while maintaining the atmosphere as it is in atomic or molecular arsenic, the resistance heater 15 is turned off. After lowering the temperature of the atmosphere around the single crystal silicon substrate 19 to about 300° C. and stopping the supply of $ASH_3$, the single crystal silicon substrate 19 is taken out altogether with the wafer tray 3 from the chamber using a transport robot.

A semiconductor device assembled with a Hall effect sensor as shown in FIG. 3 can be fabricated in the manner described above. This device comprises a single crystal silicon substrate 19 having provided thereon a surface layer, i.e., an n-GaAs layer 22 as a generator operating layer for the Hall effect sensor, and is characterized by the fact that a p-GaAs layer 21 is provided below the n-GaAs layer 22. By using this characteristic structure, the n-GaAs layer 22 can be electrically insulated and hence made favorable for fully exhibiting its performance. For further details on this particular structure comprising a p-GaAs layer 21 as a barrier layer between the n-GaAs layer 22 and the single crystal silicon substrate 19, reference should be made to JP-A-Hei-2-98983 filed by the present inventors.

To further illustrate the distinct future of the semiconductor device according to the present invention, several experiments were conducted on a device according to the present invention and conventional ones. The results obtained were as follows.

Figure 5:
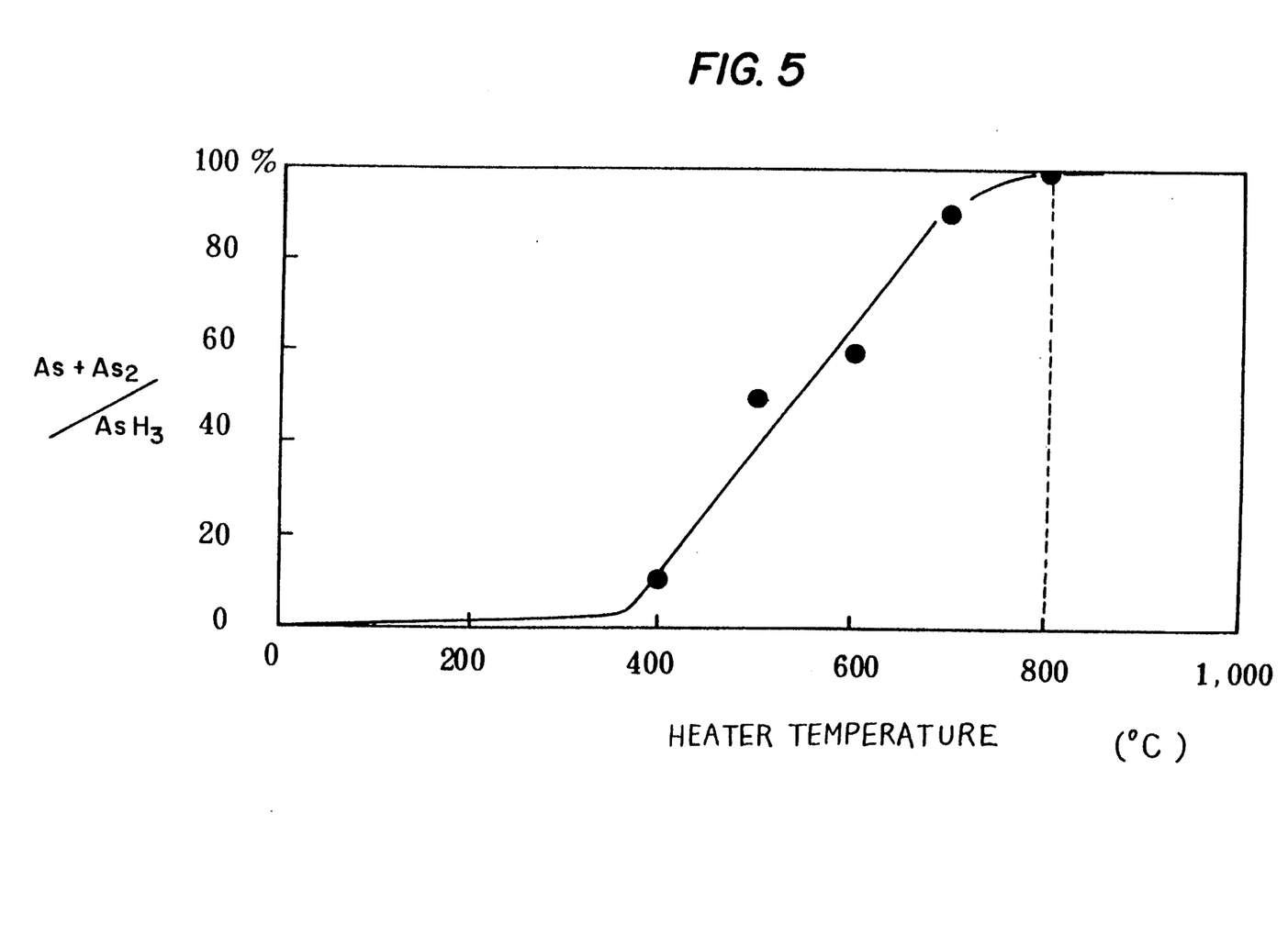
FIG. 5 is a graph showing relationship between the heating temperature and the decomposition rate of ASH$_3$.
Figure 6:
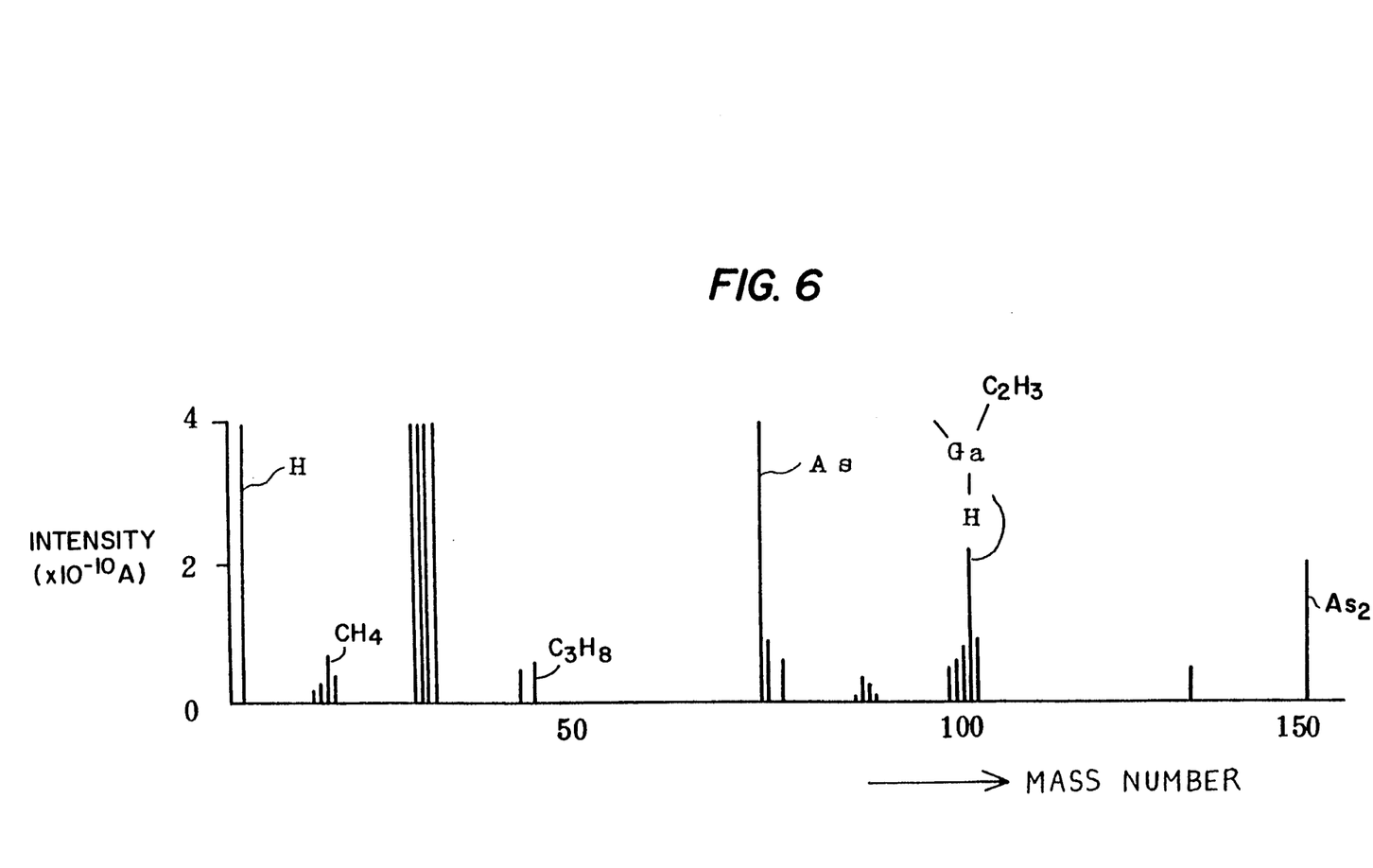
FIG. 6 is a mass spectra diagram for pyrolyzed ASH$_3$.

In a conventional MOCVD process, $AsH_3$ gas is used for the starting material. Accordingly, silicon is etched by $ASH_3$, and the GaAs layer in contact with the single crystal silicon substrate assumably contains silicon as impurities. In FIG. 5 is shown the thermal decomposition behavior of $AsH_3$ gas, and in FIG. 6 is given the mass spectra of the product obtained on pyrolyzing $AsH_3$ gas at 800° C. It can be seen from those results that $AsH_3$ gas can be thermally started to decompose into atomic arsenic As or molecular arsenic $As_2$, $As_4$ by heating $AsH_3$ gas at 800° C. in the heating furnace 10.

Figure 7:
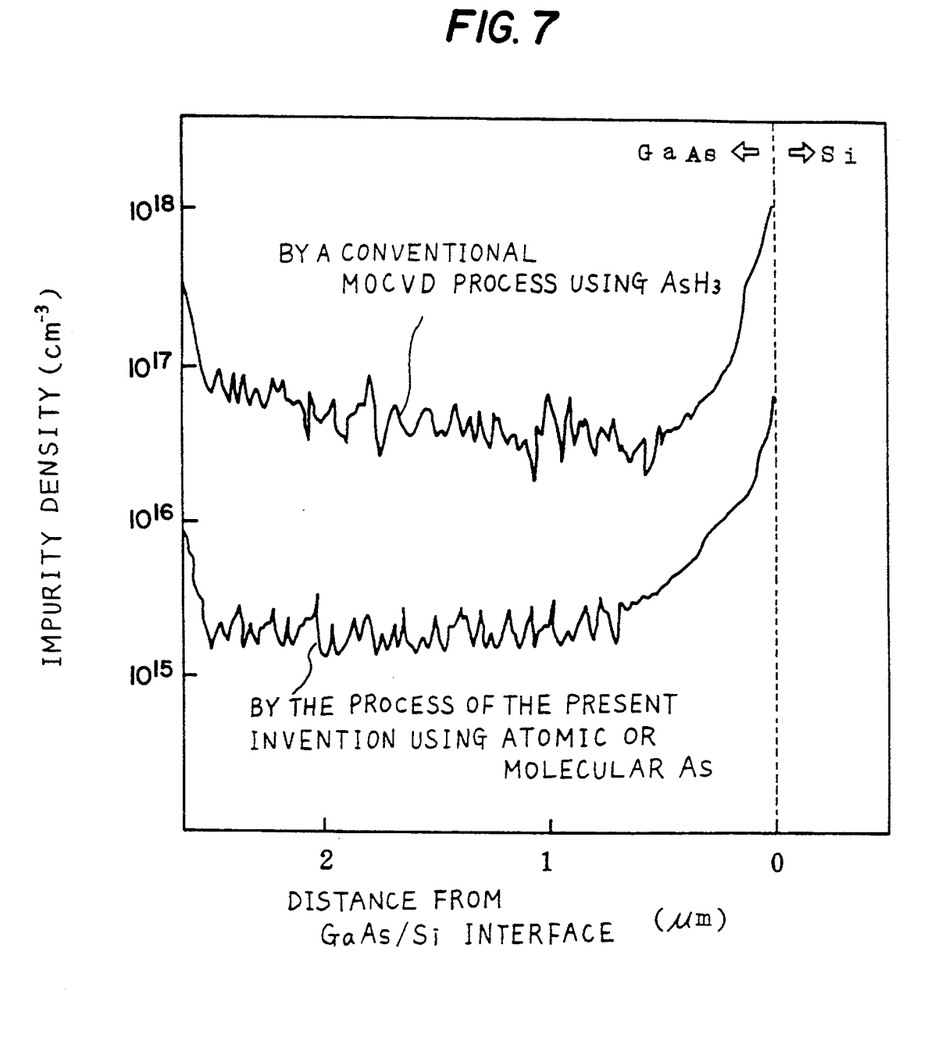
FIG. 7 is an explanatory diagram showing the differences between the process according to the present invention and a conventional MOCVD process, with respect to the density of silicon impurity being incorporated into the GaAs layer.

In FIG. 7 is shown the difference between the process according to the present invention and a conventional one in the distribution of silicon impurities inside the GaAs layer. In other words, the difference in the distribution of silicon impurities inside the GaAs layer is illustrated, between a GaAs layer deposited by a process using atomic or molecular arsenic together with TEGa and a GaAs layer deposited by a conventional MOCVD process using $AsH_3$ and TEGa. It can be clearly read from this figure that the use of atomic or molecular arsenic reduces the density of silicon impurity by about two orders.

Figure 8:
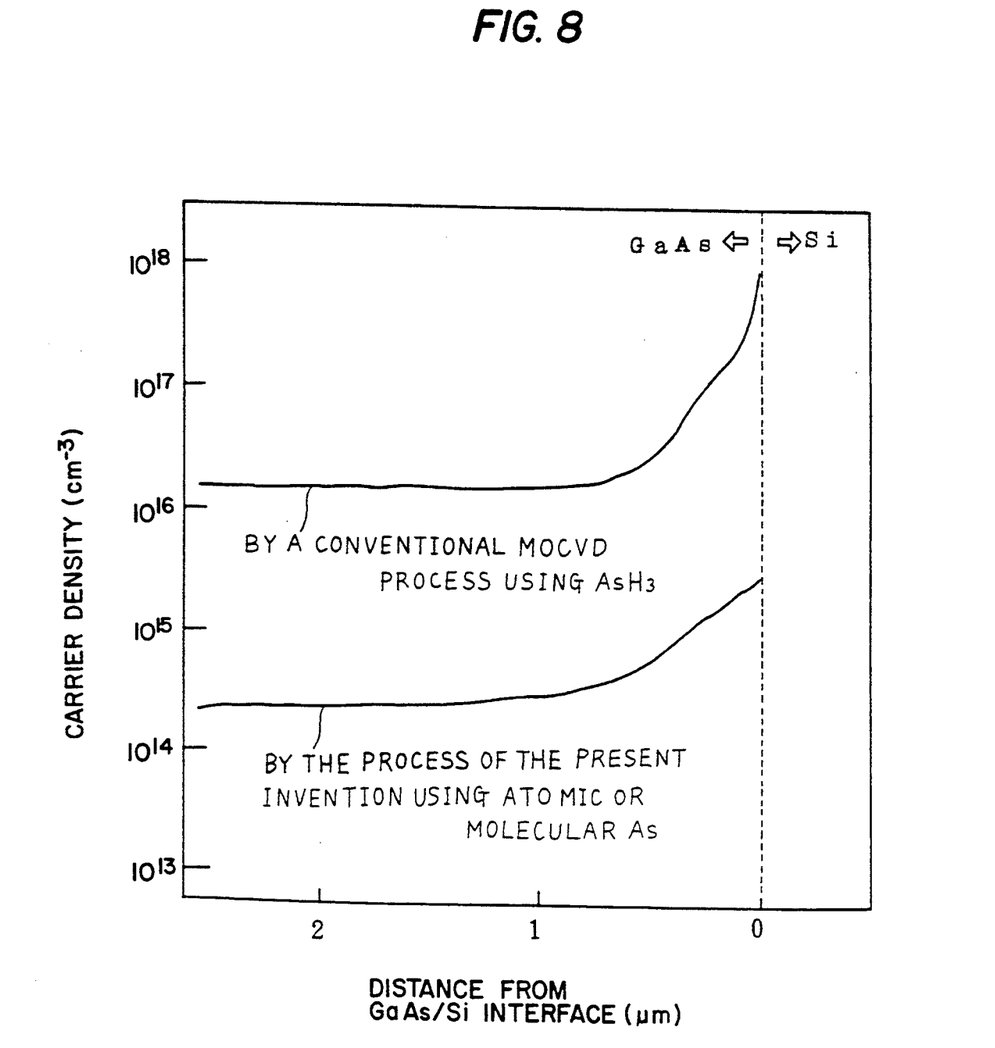
FIG. 8 is a diagram showing the differences between the process according to the present invention and a conventional MOCVD process, with respect to carrier density profile along the depth direction in the GaAs layer.

FIG. 8 shows the difference between the process according to the present invention and a conventional MOCVD process, with respect to carrier density profile along the depth direction in the GaAs layer. It can be seen therefrom that the use of an atomic or molecular arsenic together with TEGa as the starting material gas provides a carrier density of about $10^{14}$ cm$^{-3}$, i.e., a carrier density well comparable to the that of a normal semi-insulating GaAs substrate.

Figure 9:
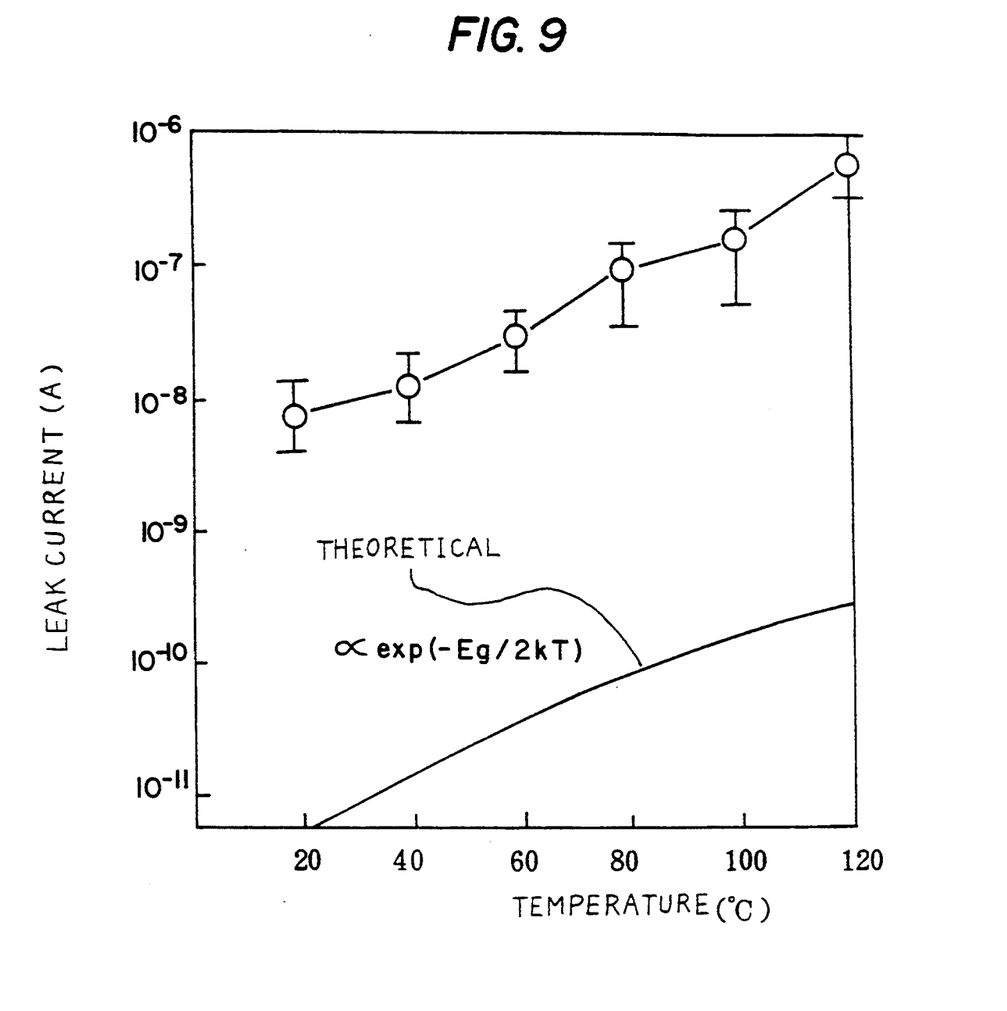
FIG. 9 is a graph showing a characteristic curve of the leak current with temperature taken as the abscissa, upon applying a reverse voltage to the silicon substrate and the n-GaAs layer thereon.

In a conventional MOCVD process disclosed in JP-A-Hei-2-98983, etc., the p-GaAs layer 21 had been deposited using diethylzinc (DEZn) as the impurity source. In FIG. 9 is given a graph for a device comprising a p-GaAs layer 21 obtained using DEZn as the impurity source, which shows a temperature-dependent characteristic curve of the leak current upon applying a reverse voltage to the silicon substrate 19 and the n-GaAs layer 22 provided thereon. It can be seen from FIG. 9 that the curve obtained on the measured leak current has the same gradient as that of the theoretical curve for a GaAs pn junction, but a leak current three orders of magnitude as large as that of the pn junction. Accordingly, the impurity profile along the depth direction of the n-GaAs/p-GaAs structure was obtained to study the reason for this large leak current. The result is given in FIG. 10. It can be seen from the figure that the impurity density curve is not so steep at the n-GaAs/p-GaAs interface in the case Zn is used as the dopant. As the reverse leak current at the n-GaAs/p-GaAs junction depends on the steepness of the density at the junction, it can be understood that the reverse leak current cannot be reduced as long as Zn is used as the impurity. Since the temperature characteristics of an unbalanced voltage of a Hall generator depends on the temperature characteristics of the reverse leak current, it follows that a large leak current impairs the temperature characteristics of the unbalanced voltage.

In a conventional MOCVD process, DEZn had been used as a p-type dopant to deposit GaAs under normal pressure. In the process according to the present invention using atomic or molecular arsenic with TEGa as the raw material gases, however, the vacuum degree during GaAs growth is as low as about 0.1 Pa. Accordingly, in the process according to the present invention, carbon, which is lower than in Zn diffusion constant in GaAs by about three orders of magnitude, can be used as a p-type dopant instead of Zn. For reference, the diffusion constant for zinc at 900° C. is in the range of from $10^{-12}$ to $10^{-13}$ cm²/sec, and that for carbon is $10^{-16}$ cm²/sec.

Figure 10:
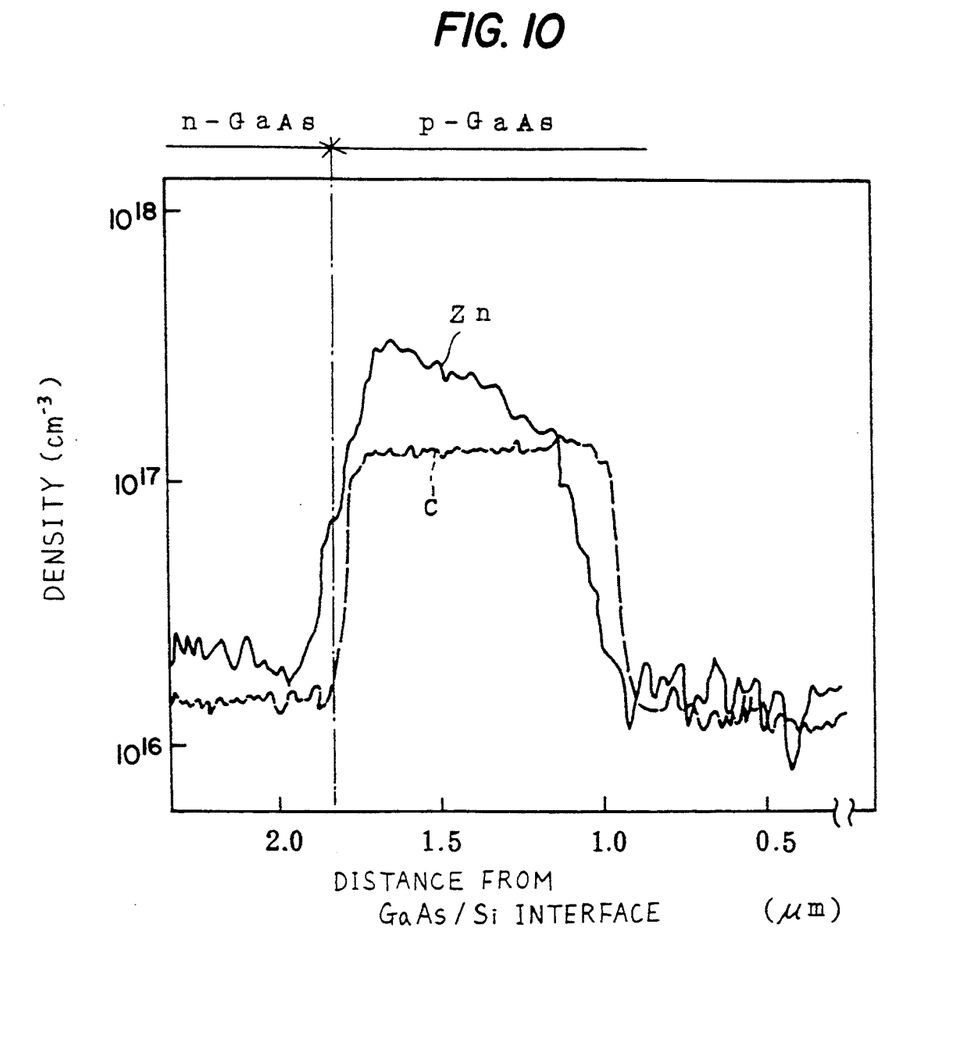
FIG. 10 is a diagram illustrating an impurity profile along the depth direction of an n-GaAs/p-GaAs structure.
Figure 11:
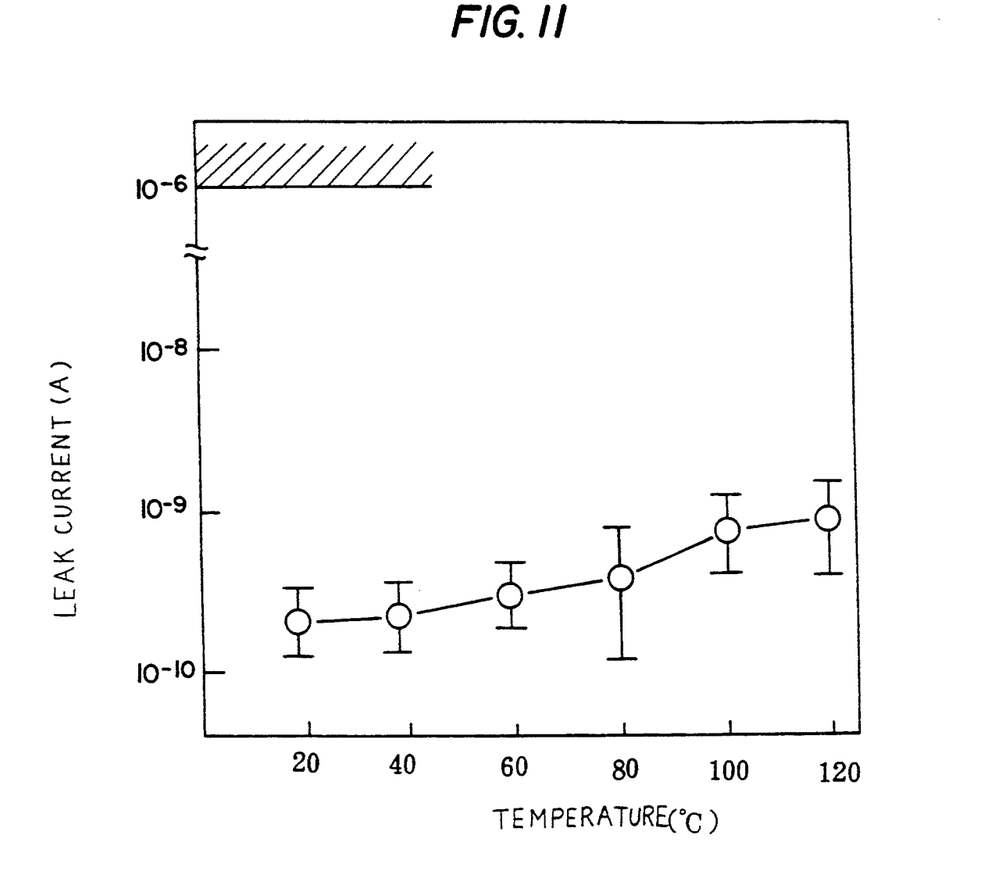
FIG. 11 is a graph showing a characteristic curve of the reverse leak current with temperature taken as the abscissa.

In FIG. 10 is also shown the impurity profile along the depth direction in an n-GaAs/p-GaAs structure using carbon (C) as the p-type impurity. The figure shows that the case using carbon as the impurity yields a steeper density curve at the n-GaAs/p-GaAs boundary. In FIG. 11 is shown a temperature-characteristic curve of the reverse leak current for a n-GaAs/p-GaAs junction structure constructed from a carbon-doped p-GaAs layer 21 and a Si-doped n-GaAs layer 22 obtained using SiH₄ as the silicon source. Upon comparing the curves shown in FIGS. 9 and 11, it can be seen that the leak current can be lowered by two orders of magnitude by using carbon instead of Zn as the p-type impurity.

Figure 12:
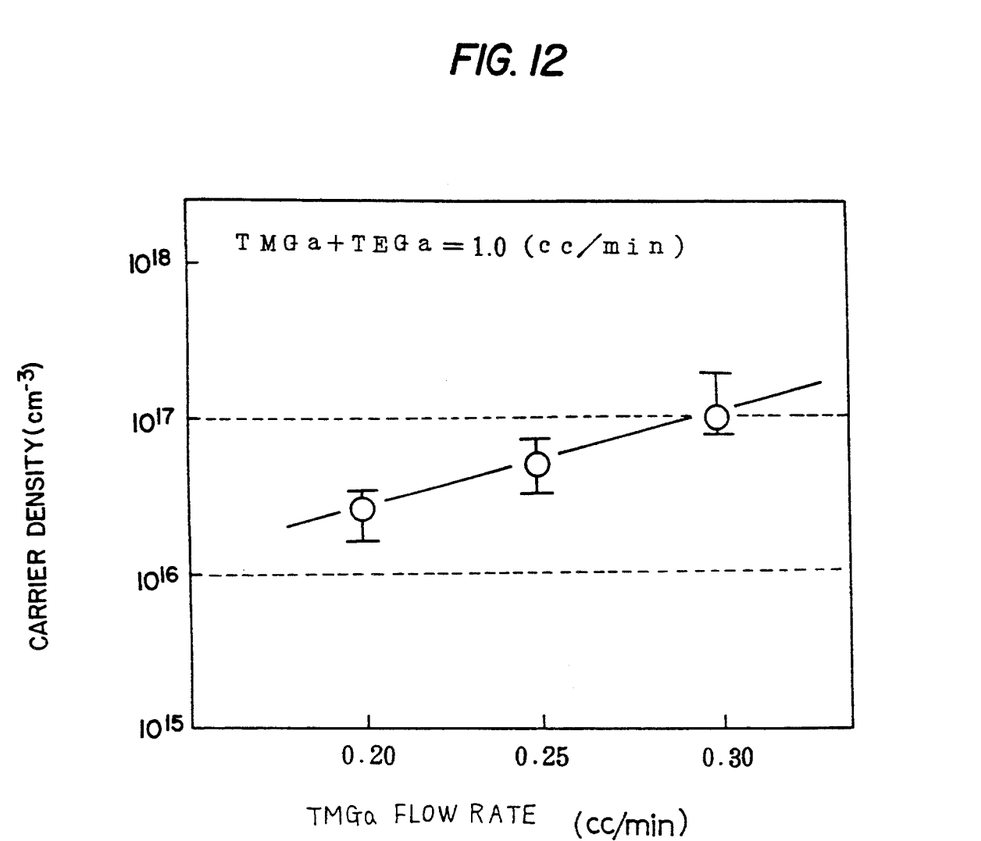
FIG. 12 is a graph illustrating impurity controllability in a p-GaAs layer using C as a dopant.

In FIG. 12 illustrated the impurity is controllability in a p-GaAs layer 21 obtained by the process according to the present invention, in which C is used as the dopant. By using TMGa as the carbon source and controlling the TEGa/TMGa ratio, the impurity density can be controlled as desired in the density range of from $10^{16}$ to $10^{17}$ cm$^{-3}$.

As described in the foregoing, the process according to the present invention comprises epitaxially growing GaAs layers (arsenide compound semiconductor layers) 20, 21, and 22 on a single crystal silicon substrate 19 using atomic or molecular arsenic as the growing atmosphere. If a hydride of arsenic (ASH₃) should be incorporated in the atmosphere, silicon would be taken up inside the GaAs layer during the growth of GaAs layer and rendered n⁺-conductive, but by thus epitaxially growing GaAs layer on a single crystal silicon substrate under an atmosphere composed of atomic or molecular arsenic, the incorporation of silicon inside the growing GaAs layer can be avoided.

Furthermore, the process according to the present invention is carried out in an atomic or molecular arsenic atmosphere at a temperature range of from 400° to 650° C. under a vacuum degree of about 0.1 Pa. Accordingly, DEZn, which had been used as a p-type dopant in a conventional MOCVD process to effect the deposition of a GaAs layer particularly under a normal pressure, can be replaced by carbon (TMGa) which is lower in diffusion constant in GaAs by about three digits than Zn.

In order to improve the electric characteristics of a GaAs Hall effect sensor, the n-GaAs layer 22 is deposited on the single crystal silicon substrate 19 while incorporating therebetween a p-GaAs layer. In this manner, the barrier potential attributed to the n/p junction is established to cut off the current path to the GaAs layer located at the vicinity of the GaAs/Si interface which is rich in defects (i.e., high in leak current). This n-GaAs/p-GaAs junction, however, must withstand the power voltage of about 24 V. Hence, the carrier density of the p-GaAs layer 21 should be controlled in the range of from $1 \times 10^{16}$ to $1 \times 10^{17}$ cm$^{-3}$. However, DEZn which had been used as a p-type dopant gas in the conventional MOCVD processes allowed silicon to enter as an impurity into the undoped GaAs layer as shown in FIG. 13. This made the control of the carrier density in the p-GaAs layer considerably more difficult. More disadvantageously, the use of DEZn as the dopant gas allowed Zn (which is believed to originate from Zn remaining in the piping) to be taken up in the n-type side of the p/n interface, thereby making it impossible to form a step-like distribution of the carriers at the junction. This leads to the failure of establishing the intended p-GaAs/n-GaAs junction structure. In contrast to the foregoing, the use of TMGa as the dopant gas as in the present invention, the problem above can be solved to yield a carrier distribution profile as shown in FIG. 10 and the carrier density can be thereby controlled.

The present invention is not only limited to the example described hereinbefore, and atomic or molecular arsenic include As₄ in addition to the aforementioned As and As₂. Furthermore, the supply source for arsenic not necessarily be ASH₃, and also usable are metallic arsenic (solid) and organic arsenic (liquid), which are once pyrolyzed to give atomic or molecular arsenic.

The foregoing example referred only to a specific case in which GaAs was grown on a single crystal silicon substrate. However, the process according to the present invention can be applied in depositing arsenic-containing compound semiconductors such as InAs, GaInAs, and GaAsP on a single crystal silicon substrate. Furthermore, the substrate need not always be single crystal silicon substrate, and those (ICs) having previously incorporated therein bipolar ICs and MOS-ICs may be used to deposit thereon GaAs layers.

Furthermore, the example above referred to a case in which an undoped GaAs layer 20 was deposited on a single crystal silicon substrate 19, followed by the deposition of a p-GaAs layer 21 containing carbon as the impurity. However, a p-GaAs layer containing carbon as the impurity may be deposited directly on the single crystal silicon substrate 19.

As described in detail hereinbefore, the present invention provides a process comprising epitaxially growing a compound semiconductor layer containing at least arsenic on a single crystal silicon substrate, which effectively prevents the silicon impurities from intruding into the compound semiconductor containing at least arsenic.

While the invention has been described in detail and with reference to specific embodiments thereof, it will be apparent to one skilled in the art that various changes and modifications can be made therein without departing from the spirit and scope thereof.

What is claimed is:

1. A process for fabricating a compound semiconductor device, which comprises epitaxially growing a compound semiconductor layer containing at least arsenic on a single crystal silicon substrate in an atmosphere obtained as an atomic or a molecular arsenic, said atmosphere being at a temperature in the range of from 400° to 650° C. and a vacuum degree of about 0.1 Pa.

2. The process for fabricating a compound semiconductor device as claimed in claim 1, in which the atmosphere obtained as atomic arsenic is or molecular prepared by pyrolyzing AsH₃.

3. The process of claim 2, wherein said pyrolyzing is performed at a temperature of at least about 800° C.

4. The process of claim 2, wherein:
said process steps are performed in a reaction furnace into which said silicon substrate is loaded, said reaction furnace having a gas supply inlet for introducing said atomic or molecular arsenic; and
a longer of a mean free path for the atomic or molecular arsenic and a mean free path for a Ga molecule is longer than a distance between said gas supply inlet and said silicon substrate.

5. The process of claim 2, further comprising a step of:

introducing a metallorganic material gas for providing elements other than arsenic which form said compound semiconductor layer.

6. The process of claim 5, wherein said metallorganic material gas is triethylgallium.

7. The process of claim 5, further comprising a steps of:
- decomposing said atomic or molecular arsenic before said arsenic reaches said silicon substrate; and
- forming said compound semiconductor layer by a reaction of said metallorganic material gas and said decomposed arsenic.

8. The process of claim 7, wherein said metallorganic gas is triethylgallium.

9. The process for fabricating a compound semiconductor device as claimed in claim 1, in which carbon is used as the impurity, to thereby epitaxially grow a p-type compound semiconductor layer containing at least arsenic.

10. The process for fabricating a compound semiconductor device as claimed in claim 9, in which trimethylgallium is used as the impurity source for carbon.

11. The process of claim 10, further comprising a step of:
- controlling a rate of gallium introduction by controlling a flow rate of said trimethylgallium.

12. The process of claim 10, further comprising a steps of:
- introducing a metallorganic material gas for providing elements other than arsenic which form said compound semiconductor layer; and
- controlling the impurity density of the epitaxially grown p-type compound semiconductor crystal by varying a flow rate ratio of said metallorganic material gas and said trimethylgallium.

13. The process of claim 12, wherein said metallorganic gas is triethylgallium.

14. The process of claim 10, further comprising the steps of:
- generating said atomic or molecular arsenic by pyrolyzing arsine; and
- generating said carbon by a reaction of said trimethylgallium and said atomic or molecular arsenic.

* * * * *